US010366943B2

United States Patent
Kim et al.

(10) Patent No.: US 10,366,943 B2
(45) Date of Patent: Jul. 30, 2019

(54) PACKAGED ELECTRONIC DEVICE HAVING STEPPED CONDUCTIVE STRUCTURE AND RELATED METHODS

(71) Applicant: Amkor Technology, Inc., Tempe, AZ (US)

(72) Inventors: Byong Jin Kim, Gyeonggi-do (KR); Jia Yunn Ting, Selangor (MY); Hyeong Il Jeon, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 35 days.

(21) Appl. No.: 15/706,688

(22) Filed: Sep. 16, 2017

(65) Prior Publication Data
US 2019/0088574 A1    Mar. 21, 2019

(51) Int. Cl.
H01L 29/06    (2006.01)
H01L 23/495   (2006.01)
H01L 23/535   (2006.01)

(52) U.S. Cl.
CPC .. *H01L 23/49513* (2013.01); *H01L 23/49541* (2013.01); *H01L 23/49575* (2013.01); *H01L 23/535* (2013.01)

(58) Field of Classification Search
USPC .......... 257/676, 678–733, 787–796, 257/E23.001–E23.194, E23.031, 666, 257/E23.092, E23.032, E23.036, E23.042; 438/15, 26, 51, 55, 64, 106, 124–127
See application file for complete search history.

(56) References Cited

U.S. PATENT DOCUMENTS

| 6,608,366 B1 | 8/2003 | Fogelson et al. |
| 6,696,747 B1 | 2/2004 | Lee et al. |
| 2005/0269696 A1 | 12/2005 | Ochiai |

(Continued)

OTHER PUBLICATIONS

Pending U.S. Appl. No. 15/460,032, by Yeo Siang Miang et al., entitled "Method of Forming a Packaged Semiconductor Device Using Ganged Conductive Connective Assembly and Structure", filed Mar. 15, 2017, Assignee: Amkor Technology Inc., 39 pages.

(Continued)

*Primary Examiner* — Niki H Nguyen
(74) *Attorney, Agent, or Firm* — Kevin B. Jackson (57) ABSTRACT

An electronic package includes a substrate having a conductive element. The conductive element includes a stepped portion disposed at an end of the conductive element. In one embodiment, the conductive element is a lead. In another embodiment, the conductive element is a die pad. The stepped portion includes a first groove extending inward from a lower surface of the first conductive element, and a second groove extending further inward from the first groove towards an upper surface of the conductive element. An electronic component is connected to the conductive element. In one embodiment, a clip is used to electrically connect the electronic component to the conductive element. An encapsulant encapsulates the electronic component and a portion of the substrate such that the stepped portion is exposed outside an exterior side surface of the encapsulant. The stepped portion is configured to improve the bonding strength of the electronic package when attached to a next level of assembly.

20 Claims, 5 Drawing Sheets

(56) References Cited

U.S. PATENT DOCUMENTS

2016/0254214 A1* 9/2016 Makino .................. H01L 24/97
257/676
2018/0247883 A1* 8/2018 Imori ................ H01L 23/49537

OTHER PUBLICATIONS

Pending U.S. Appl. No. 15/700,101, by Pedro J. Rivera-Marty, entitled "Method of Forming a Packaged Semiconductor Device Having Enhanced Wettable Flank and Structure", filed Sep. 9, 2017, Assignee: Amkor Technology, Inc., 44 pages.

* cited by examiner

PACKAGED ELECTRONIC DEVICE HAVING STEPPED CONDUCTIVE STRUCTURE AND RELATED METHODS

CROSS-REFERENCE TO RELATED APPLICATIONS

Not Applicable.

BACKGROUND OF THE DISCLOSURE

The present invention relates, in general, to electronics, and more particularly, to semiconductor packages, structures thereof, and methods of forming semiconductor packages.

In the past, semiconductor packages, such as Plastic Quad Flat Pack No-lead (PQFN) or Quad Flat Pack No-Lead Exposed Pad (QFN-EP) packages have not had easily solderable, visually exposed terminations, because the package designs had terminations on the underside of the semiconductor package for solder joints. The terminations on the edges of such semiconductor packages, which were exposed after singulation, consisted of exposed copper. The exposed copper did not easily solder wet because of copper oxidation. Thus, visual determination that the semiconductor package had soldered effectively to a next level of assembly, such as a printed circuit board, could not be made by optical viewing. Electrical test was the only way to determine electrical connectivity of the soldered terminations. There are some applications where full electrical test of all terminations is difficult or incomplete. Thus, in high reliability applications, such as automotive applications, it has been desired to visually check for termination solder joint integrity. It is for these purposes that wettable flanks, which are solder plated terminations of semiconductor packages, have been developed as a visual aid for the determination of solder operation effectiveness.

Wettable flank plating is an additional process step that deposits a solderable conductive material, such as tin, with a normal conductive material thickness, on the semiconductor package underside terminals and on the exposed edge terminations or flanks. The wettable flank plating protects the copper and allows soldering to occur on this external flank area of the terminations such that optical inspection can be made verifying a good solder fillet joint, and thus a good electrical connection. Although progress has been made in wettable flank processes, improvements in conductive substrate structures and methods of forming such structures are needed to further enhance wettable flanks.

Accordingly, it is desirable to have a structure and a method that provides a packaged semiconductor device that improves the wettable surface coverage for side or flank surfaces of a conductive substrate. It is also desirable for the structure and method to be easily incorporated into manufacturing flows, accommodate multiple die interconnect schemes, and to be cost effective.

BRIEF SUMMARY

The present description includes, among other features, an electronic package structure and a method of forming that includes a substrate with a conductive element. The conductive element includes a stepped portion having at least two grooves disposed at an end of the conductive element. In one embodiment, an electronic component is connected to the conductive element and a package body encapsulates the electronic component and a portion of the substrate. The stepped portion is exposed outside an exterior side surface of the package body. The stepped portion is configured to enhance the bonding strength compared to related devices when the electronic package structure is attached to a next level of assembly, such as a printed circuit board. Specifically, the structure and method provide for improved reliability by facilitating stronger solder joints compared to previous approaches.

More particularly, in one embodiment, an electronic package comprises a substrate having a first conductive element. The first conductive element comprises a first stepped portion disposed at a first end of the first conductive element. The first stepped portion comprises a first groove extending inward from a lower surface of the first conductive element, and a second groove extending further inward from the first groove towards an upper surface of the first conductive element. An electronic component is connected to the first conductive element. An encapsulant encapsulates the electronic component and a portion of the substrate such that the first stepped portion is exposed outside an exterior side surface of the encapsulant.

In another embodiment, a semiconductor package comprises a lead frame including a die pad and a lead. A semiconductor device is electrically connected to the lead. An encapsulant encapsulates the semiconductor die and portions of the lead frame. A first stepped portion comprising a first groove and a second groove is disposed at a first end of the lead frame, and the first stepped portion is exposed outside a first exterior side surface of the encapsulant.

In a further embodiment, a method of forming an electronic package comprises providing a substrate having a first conductive element, wherein the first conductive element comprises a first stepped portion disposed at a first end of the first conductive element; and the first stepped portion comprises a first groove extending inward from a lower surface of the first conductive element, and a second groove extending further inward from the first groove towards an upper surface of the first conductive element. The method includes connecting an electronic component to the first conductive element. The method includes providing an encapsulant encapsulating the electronic component and a portion of the substrate such that the first stepped portion is exposed outside a first exterior side surface of the encapsulant.

BRIEF DESCRIPTION OF THE DRAWINGS

FIGS. 6A, 6C, and 6E illustrate partial cross-sectional views

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

Figure 1A:
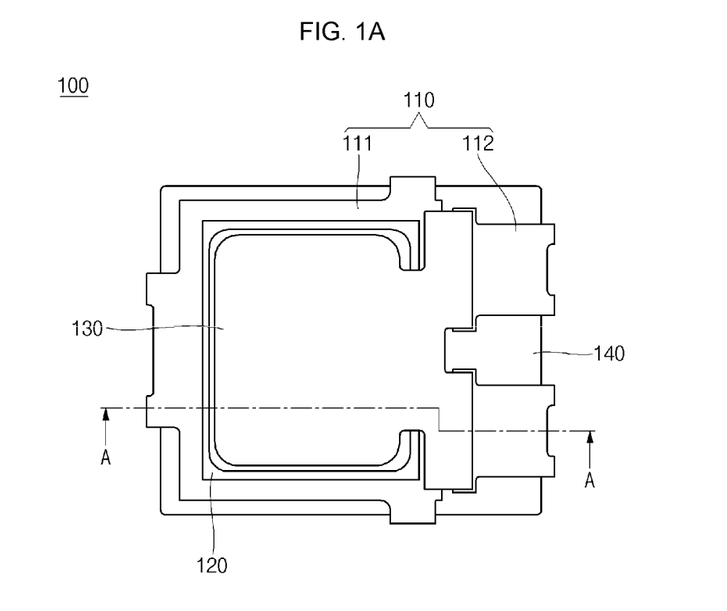
FIGS. 1A and 1B illustrate plan views of an electronic packages according to embodiments of the present invention.
Figure 1B:
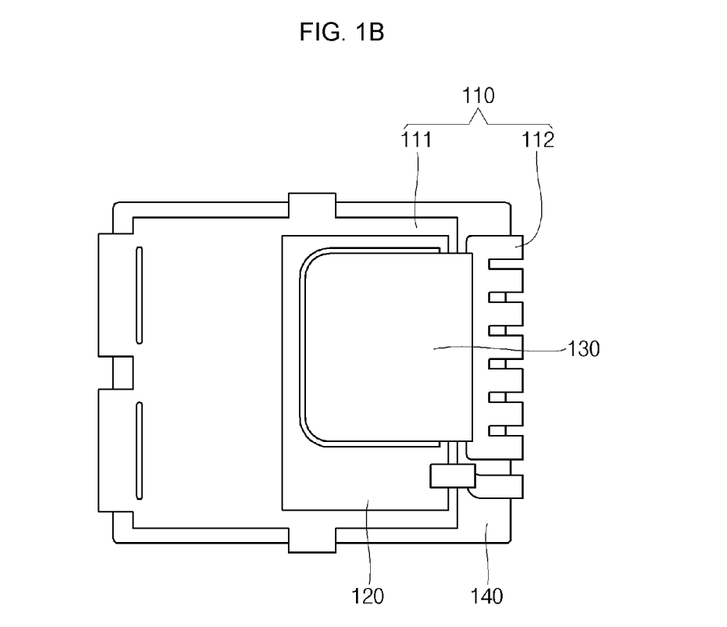
Figure 2:
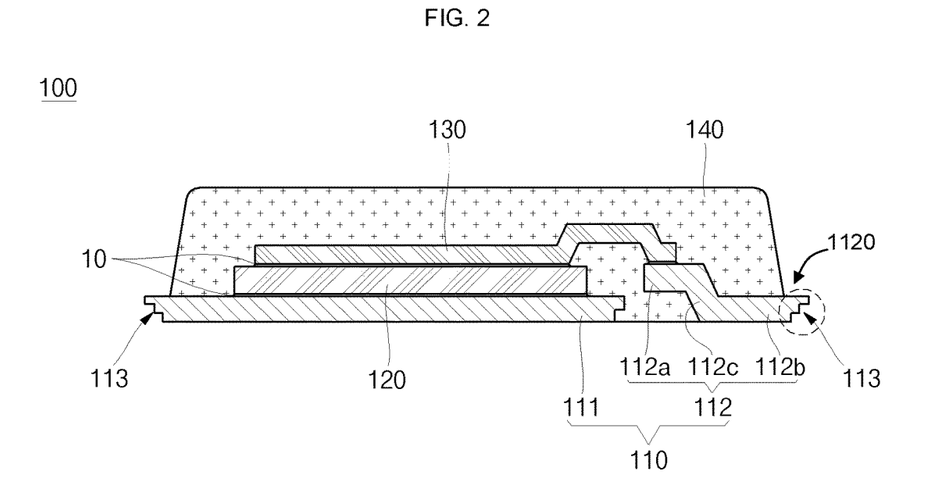
FIG. 2 illustrates a cross-sectional view taken along reference line A-A of FIG. 1A.
Figure 3:
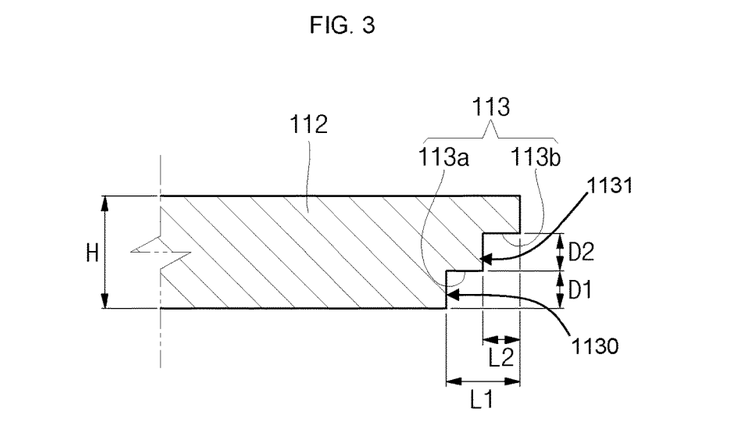
FIG. 3 illustrates an enlarged cross-sectional view of a conductive structure having the stepped portions illustrated in FIG. 2.
Figure 4:
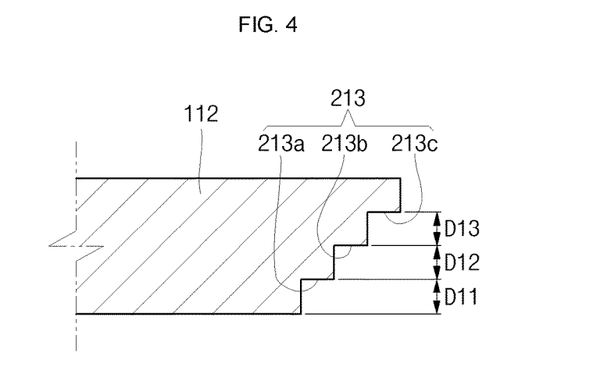
FIG. 4 illustrates a cross-sectional view of a conductive structure having stepped portions according to another embodiment of the present invention.
Figure 5:
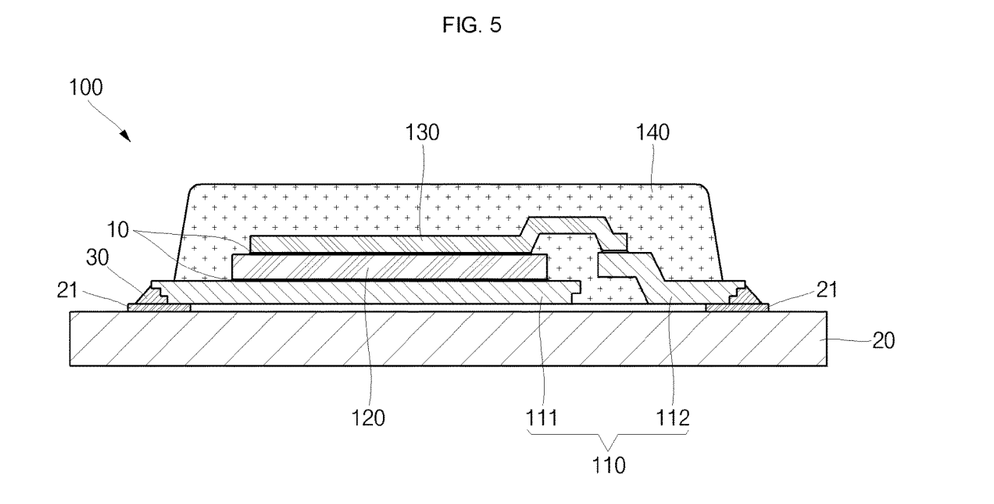
FIG. 5 illustrates a cross-sectional view of the electronic package of FIG. 1A attached to substrate in accordance with embodiment of the present invention.

FIGS. 1A and 1B illustrate top plan views of packaged electronic devices according to embodiments of the present disclosure, FIG. 2 illustrates a cross-sectional view taken along reference line A-A of FIG. 1A, FIG. 3 illustrates an enlarged cross-sectional view of a conductive structure having stepped portions illustrated in FIG. 2, FIG. 4 illustrates a cross-sectional view of a conductive structure having stepped portions according to another embodiment of the present disclosure, and FIG. 5 illustrates a cross-sectional view of the electronic package of FIG. 1A attached to a next level of assembly, such as a substrate in accordance with an embodiment of the present disclosure.

With reference now to FIGS. 1A to 3, in some embodiments a packaged electronic device 100, such as a packaged semiconductor device 100 or semiconductor package 100 includes a conductive substrate 110, such as a lead frame 110; an electronic component 120, such as an electronic die 120, a semiconductor die 120, or a semiconductor device 120; a conductive connective structure 130, such as a connection member 130; and a package body 140, such as an encapsulant 140. Encapsulant 140 is illustrated in the transparent in FIGS. 1A and 1B to illustrate the other elements of semiconductor package 100.

In some embodiments, the lead frame 110 includes a conductive element 111, such as a die pad 111 and a conductive element 112, such as one or more leads 112. As illustrated in FIG. 1A, the semiconductor package 100 can have two leads 112. As illustrated in FIG. 1B, the semiconductor package 100 can more than two leads 112. The number of the leads 112 as well as the placement of leads 112 with respect to the die pad 111 may vary according to the application of the semiconductor package 100.

The lead frame 110 comprises a conductive material, such as metal or a metal coated substrate. In some embodiments, lead frame 110 comprises one or more of silver (Ag), copper (Cu), aluminum (Al), nickel (Ni) or other materials known to those skilled in the art. In an example embodiment, the lead frame 110 may include copper (Cu). By way of example, the lead frame 110, including the die pad 111 and the lead 112, may be formed using general dry etching or wet etching on a metal plate formed of copper (Cu) and masking materials.

In one embodiment, the die pad 111 is shaped of a generally rectangular plate. The semiconductor die 120 is connected to or attached to die pad 111 using die attach material 10, such as an adhesion member 10. In some embodiments, the die pad 111 may be electrically connected to the semiconductor die 120. By way of example, the die attach material 10 can be a solder paste, a conductive epoxy, conductive adhesives, conductive films, non-conductive epoxy, non-conductive adhesives, non-conductive films, or other suitable attach materials known to those skilled in the art. In some embodiments, non-conductive refers to electrically insulating and it is understood that such materials may still be thermally conductive. In some embodiments, the semiconductor die 120 is an integrated circuit device, a power semiconductor device, an optical device, a sensor device, or other devices known to those skilled in the art. In FIG. 1A, the semiconductor die 120 is illustrated as a diode device. In FIG. 1B, the semiconductor die 120 is illustrated as a power transistor device, such as a bipolar transistor, a metal-oxide-semiconductor field effect transistor (MOSFET) device, or an insulated gate bipolar transistor (IGBT) device.

Those skilled in the art will appreciate that the semiconductor die 120 is illustrated in simplified form in FIGS. 3 and 5, and may further include multiple diffused regions, multiple conductive layers, and multiple dielectric layers. One end of the die pad 111 may be exposed to the outside of the semiconductor package 100 to then be connected to an external circuit. In accordance with one embodiment, stepped portions 113 are formed at the end of the die pad 111 exposed to an exterior side of the semiconductor package 100. The stepped portions 113 will be described in more detail later.

In some embodiments, the leads 112 are disposed to be spaced apart from the die pad 111, and may be positioned along one or more sides of the die pad 111. The leads 112 are configured to carry electrical signals to and from the semiconductor die 120, and to and from the outside of the semiconductor package 100. In accordance with some embodiments, one or more of the leads 112 include a die connecting portion 112*a*, which is disposed to be connected to the semiconductor die 120, an external connecting portion 112*b*, which is disposed to connect the die connecting portion 112*a* to a circuit external to the semiconductor package 100, and an internal connecting portion 112*c*, which is disposed between the die connecting portion 112*a* and the external connecting portion 112*b*. The internal connecting portion 112*c* is configured to connect the die connecting portion 112*a* and the external connecting portion 112*b* to together. The shape of the lead 112 can be provided using bending techniques or other techniques known to those skilled in the art.

In some embodiments, the die connecting portion 112*a* is disposed at one side of the lead 112 to be proximate to the die pad 111. The die connecting portion 112*a* may be formed to be positioned higher than or elevated above the die pad 111. More particularly, the die connecting portion 112*a* resides on a different plane than the die pad 111. In some embodiments, the external connecting portion 112*b* is disposed at the other or opposite side of the lead 112 distal to the die pad 111, and in accordance with the present embodiment, includes a portion 1120 exposed to the outside of the encapsulant 140 and to the exterior side of the semiconductor package 100. In accordance with the present embodiment, the portion 1120 is configured to be electrically connected to an external circuit. In some embodiments, the external connecting portion 112*b* may be formed to be positioned at the same height with the die pad 111, and a height difference is created between the external connecting portion 112*b* and the die connecting portion 112*a*. Therefore, in order to connect the die connecting portion 112*a* and the external connecting portion 112*b* having different heights, the internal connecting portion 112*c* is formed at an angle between portions 112*a* and 112*b*. In other embodiments, the lead 112 may have the same height with the die pad 111 and may be formed to have a shape of a generally planar plate.

The distal end of the external connecting portion 112*b* is exposed to the outside of encapsulant 140 and exposed to the outside of the exterior side of the semiconductor package 100, and the other or opposite end of connecting portion 112*b* is connected to the internal connecting portion 112*c*. In accordance with the present embodiment, the stepped portions 113 are formed at the distal end (with respect to the die pad 111) of the lead 112 and are exposed to the outside of encapsulant 140 and exposed to the exterior side of the semiconductor package 100. In addition, in some embodiments, the stepped portions 113 are formed both at the end of the die pad 111 and the end(s) of the lead(s) 112 of the lead frame 110. Since the stepped portion 113 formed at the die pad 111 and the stepped portion 113 formed at the lead 112 can have the same configuration or similar configurations, the following description will focus on the stepped portion 113 formed at the lead 112.

In the present embodiment, the stepped portion 113 is stepwise formed inward from a bottom surface of the lead 112. The stepped portion 113 may be formed using dry etching or wet etching of the bottom surface of the lead 112 together with one or more masking layers. In the present embodiment, the stepped portion 113 includes a first groove 113*a* and a second groove 113*b*. The first groove 113*a* is formed to have a first depth D1 inward from the bottom surface of the lead 112, and the second groove 113*b* is formed to have a second depth D2 from the first groove 113*a* further inward and toward a top surface of the lead 112.

Therefore, the stepped portion 113 may be stepwise formed. Here, the first depth D1 and the second depth D2 may be equal to each other. For example, the first depth D1 of the first groove 113*a* may be one third (⅓) the entire height H of the lead 112, and the second depth D2 of the second groove 113*b* may be one third (⅓) the entire height H of the lead 112. In other embodiments, the first depth D1 and the second depth D2 can be different. In addition, the first groove 113*a* is positioned at the interior side of the lead 112 relative to the second groove 113*b*. More particularly, the first groove 113*a* has a horizontal length L1 greater than a horizontal length L2 of the second groove 113*b*. The horizontal length L1 of the first groove 113*a* corresponds to that of the stepped portion 113. This configuration provides vertical face 1130 of the first groove 113*a* disposed laterally inward from vertical face 1131 of the second groove 113*b* with respect to the distal end of lead 112.

As set forth previously, the stepped portion 113 is formed at the exterior side of the encapsulant 140. More particularly, in a preferred embodiment the stepped portion 113 is formed such that its horizontal length L1 is not disposed laterally beyond a portion where the encapsulant 140 is formed around the lead 112. This is because a relatively long horizontal length L1 of the stepped portion 113 can prevent solder from completely penetrating into the stepped portion 113 when the semiconductor package 100 is connected to an external circuit. In doing so, an empty space or void may be created in the stepped portion 113, thereby undesirably reducing the fastening force or bonding strength between the semiconductor package 100 and the external circuit. Stated a different way, it is preferred in most embodiments that the exterior side surface of encapsulant 140 does not extend to laterally overlap vertical face 1130 of the first groove 113*a* in a cross-sectional view as generally illustrated in FIG. 2.

The stepped portions 113 are formed at the ends of the lead 112 and/or the die pad 111 and facilitate soldering between each of the lead 112 and/or the die pad 111 and pads of the external circuit when the semiconductor package 100 is connected to the external circuit. More particularly, the stepped portions 113 increase solder contact areas for the lead 112 and/or the die pad 111, thereby improving the fastening force or bonding strength between each of the lead 112 and/or the die pad 111 and the pads of the external circuit. It is understood that in some embodiments, an additional conductive layer can be formed along exposed portions of the stepped portions 113 as well as exposed portions of the lead 112 and the die pad 111. By way of example, the conductive layer can be a solderable material, such as tin (Sn) provided using plating techniques or other techniques known to those skilled in the art.

In an alternative embodiment, as illustrated in FIG. 4, stepped portions 213 may include a first groove 213*a*, a second groove 213*b* and a third groove 213*c*. More particularly, the stepped portions 213 may include a first groove 213*a* formed to have a first depth D11 from a bottom surface of the lead 112, a second groove 213*b* formed to have a second depth D12 from the first groove 213*a*, and a third groove 213*c* formed to have a third depth D13 from the second groove 213*b*. As described above, the stepped portions 213 including three grooves are configured such that horizontal lengths of the respective grooves 213*a*, 213*b* and 213*c* are smaller than those of the stepped portions 113 including two grooves. In such a manner, the stepped portions 213 including three grooves and the stepped portions 113 including two grooves may be formed to have the same overall length. It understood that stepped portions 213 can include more than three grooves in other embodiments.

As set forth previously, the semiconductor die 120 is mounted on the die pad 111 and is electrically connected to the die pad 111 using the die attach material 10. The die attach material 10 can be, for example, a conductive adhesive material 10, such as a solder. In addition, the semiconductor die 120 may comprise silicon or other semiconductor materials and may have vertical devices (that is, current carrying electrodes provided on opposing major surfaces of the semiconductor die 120) disposed therein. Each of the vertical devices has at least one input unit at one side and an output unit at the other side to allow a current to vertically flow through the semiconductor die 120.

The connection member 130 electrically connects the semiconductor die 120 and the lead 112 together. In embodiments requiring high power performance, such as power semiconductor devices configured to conduct a relatively large amount of current, a metal clip, which has a relatively large size than a metal wire used for a general semiconductor package, is used as the connection member 130 electrically connecting the semiconductor die 120 mounted on the die pad 111 and the lead 112. More particularly, the connection member 130 may be a metal clip, such as a copper (Cu) clip. By way of example, the connection member 130 can electrically connected to the semiconductor die 120 and the lead 112 using the conductive adhesion material 10, such as a solder. In other embodiments, the connection member 130 can be one or more conductive wires, conductive ribbons, combinations thereof, or other connection structures known to those skilled in the art.

In some embodiment, the encapsulant 140 encapsulates the semiconductor die 120 and the connection member 130 and portions of the lead frame 110. The encapsulant 140 is configured to protect the semiconductor die 120 and the connection member 130 from the external environment. In addition, the encapsulant 140 exposes the bottom surface of the lead frame 110 and the one or more ends of the lead frame 110 having the stepped portions 113. The encapsulant 140 may include any one of encapsulating or molding materials (for example, a resin, a polymer composite material, a polymer having a filler, an epoxy resin, an epoxy resin having a filler, epoxy acrylate having a filler, an epoxy mold compound (EMC), a silicon resin, combinations or equivalents of these materials, or other materials as known to those skilled in the art). In addition, the encapsulant 140 may be formed by a variety of methods, such as compressive molding, transfer molding, liquid encapsulant molding, vacuum lamination, paste printing, film assisted molding, or other techniques known to those skilled in the art.

As illustrated in FIG. 5, the semiconductor package 100 can be mounted on or attached or soldered to a substrate 20, and can then be connected to the pad 21 of the substrate 20 by a conductive material 30, such as a solder 30. Accordingly, the semiconductor package 100 is electrically connected to the substrate 20. Here, the fastening force or bonding strength between the semiconductor package 100 and the substrate 20 can be improved by the stepped portions 113 formed on the lead frame 110. In accordance with the present embodiment, stepped portions 113 provide a wettable flank surface having an increased height compared to related devices using a dimple/etched lead frame technique thereby enhancing the fastening force or bonding strength of the semiconductor package 100 compared to the previous devices. In further embodiments and as set forth previously, a conductive layer (not shown), such as a solderable metal layer (for example, tin) is disposed on the exposed surfaces of leads 112 and die pad 111. The conductive layer can be formed using plating techniques or other techniques known to those skilled in the art.

Figure 6A:
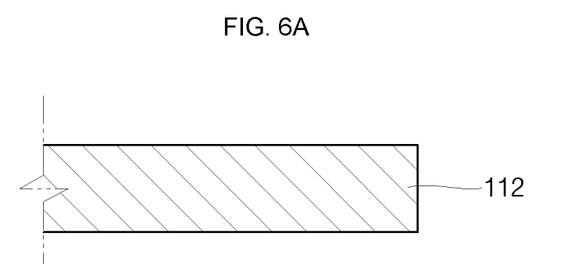
Figure 6B:
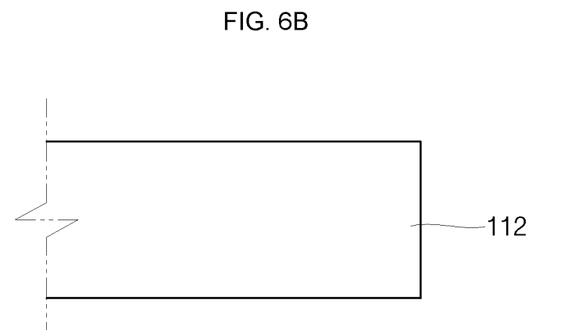
FIGS. 6B, 6D, and 6F illustrate partial bottom plan views of a conductive structure at various stages of manufacture in accordance with one or more embodiments of the present invention.
Figure 6C:
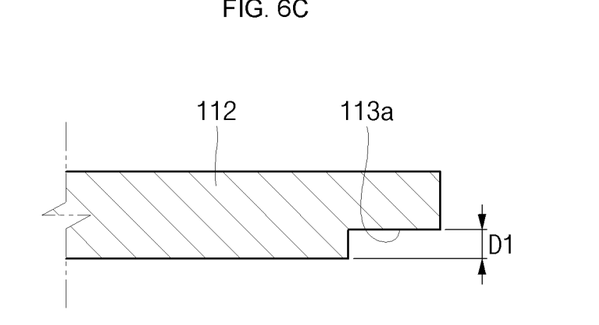
Figure 6D:
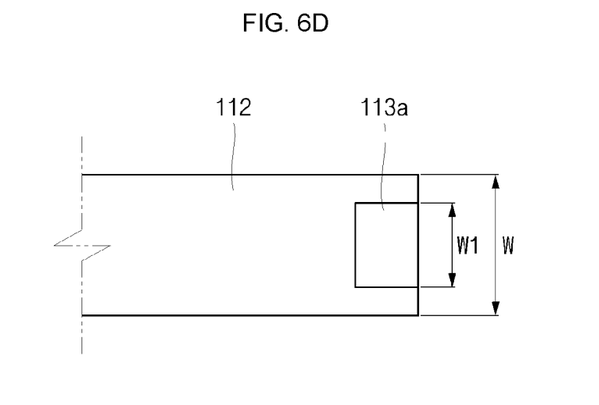
Figure 6E:
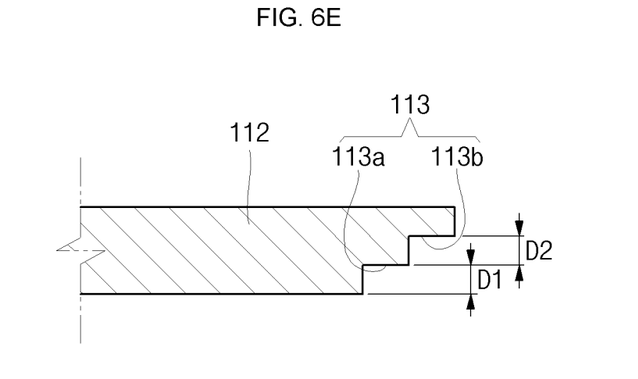

FIGS. 6A, 6C, and 6E illustrate partial cross-sectional views, and FIGS. 6B, 6D, and 6D illustrate partial bottom plan views of a conductive structure at various stages of fabrication a to form the stepped portions 113. The conductive structure can be, for example, the lead frame 110 of the semiconductor package 100. In some embodiments, stepped portions 113 can be formed on one or more of leads 112 and die pad 111. The following description will use the lead 112 as the example embodiment.

Figure 6F:
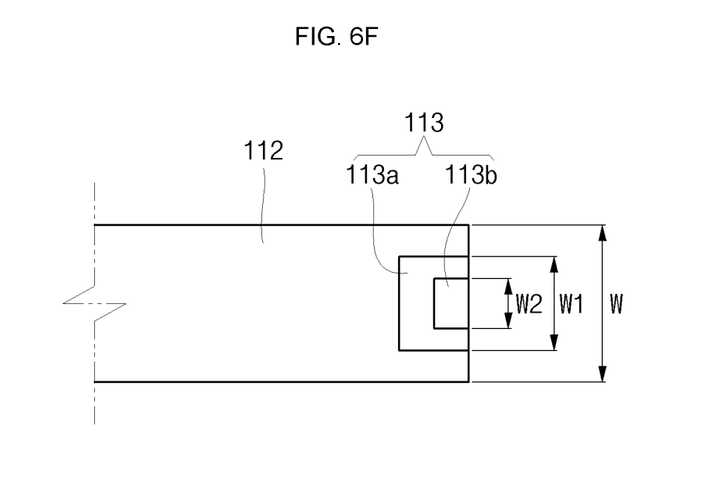

As illustrated in FIGS. 6A and 6B, the lead 112 of the lead frame 110 is first prepared. Then, as illustrated in FIGS. 6C and 6D, the first groove 113a having a first depth D1 is formed on the bottom surface of the lead 112 by, for example, etching using a masking structure (not shown). In a preferred embodiment, the first groove 113a is formed to have a smaller width than the lead 112 (W1<W). Next, as illustrated in FIGS. 6E and 6F, the second groove 113b having a second depth D2 is formed on the bottom surface of the first groove 113a by, for example, etching using a masking structure (not shown), thereby forming the stepped portions 113 on the lead 112. In addition, the second groove 113b may be formed to have a smaller width than the first groove 113a (W2<W1). A similar method can be used to form additional grooves, such as the embodiment illustrated in FIG. 4. In an alternative method, stamping techniques can be used to form the grooves 113a and 113b. In other embodiments, a combination of etching and stamping can be used. In further embodiments, laser removal or other ablation or milling techniques can be used.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. By way of example, multiple electronic devices can be attached to a substrate in side-by-side configurations, in stacked configurations, combinations thereof, or other configurations known to those skilled in the art. In addition, the packaged electronic device can leads multiple sides of the package body. Moreover, the semiconductor die can be attached to the lead frame using conductive bumps in a flip-chip configuration.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. An electronic package comprising:
   a substrate having a first conductive element, wherein:
   the first conductive element comprises a first stepped portion disposed at a first end of the first conductive element; and
   the first stepped portion comprises:
   a first groove extending inward from a lower surface of the first conductive element; and a second groove extending further inward from the first groove towards an upper surface of the first conductive element;
an electronic component coupled to the first conductive element; and
an encapsulant encapsulating the electronic component and a portion of the substrate such that the first stepped portion is exposed outside a first exterior side surface of the encapsulant,
wherein:
the first conductive element has a first width
the first groove has a second width; and
the second groove has a third width less than the second width.

2. The electronic package of claim 1, wherein:
the substrate further comprises a second conductive element;
the second conductive element comprises a second stepped portion disposed at a first end of the second conductive element; and
the second stepped portion is exposed outside a second exterior side surface of the encapsulant.

3. The electronic package of claim 2, wherein:
the substrate comprises a lead frame;
the first conductive element comprises a lead;
the second conductive element comprises a die pad;
the electronic component is attached to the die pad; and
the electronic component is electrically connected to the lead with a conductive clip.

4. The electronic package of claim 3, wherein:
the lead comprises:
 a first connecting portion disposed to be connected to the electronic component;
 a second connecting portion having the first stepped portion; and
 a third connecting portion configured to connect the first connecting portion to the second connecting portion; and
the first connecting portion resides on a different plane than the die pad.

5. The electronic package of claim 1, wherein:
the first groove has a first vertical face disposed at a first horizontal length inward from the first end of the first conductive element;
the second groove has a second vertical face disposed at second horizontal length inward from the first end of the first conductive element;
the first horizontal length is greater than the second horizontal length; and
the first exterior side surface of the encapsulant does not laterally overlap the first vertical face in a cross-sectional view.

6. The electronic package of claim 1, wherein the first stepped portion further comprises a third groove extending further inward from the second groove toward the upper surface of the first conductive element.

7. The electronic package of claim 1, wherein:
the first width is greater than the second width.

8. The electronic package of 1, wherein:
the substrate further comprises a second conductive element comprising a die pad;
the die pad comprises a second stepped portion disposed at a first end of the die pad;
the second stepped portion is exposed outside a second exterior side surface of the encapsulant; and
the first conductive element comprises a lead.

9. The electronic package of claim 1 further comprising:
a second substrate having pad, wherein:
the electronic package is attached to the substrate;
the first stepped portion is attached to the pad with a conductive material; and
the conductive material covers the first stepped portion.

10. A semiconductor package comprising:
a lead frame including a die pad and a lead;
a semiconductor device electrically coupled to the lead; and
an encapsulant encapsulating the semiconductor die and portions of the lead frame,
wherein:
a first stepped portion comprising a first groove and a second groove is disposed at a first end of the lead;
the first stepped portion is exposed outside a first exterior side surface of the encapsulant;
a second stepped portion comprising at least two grooves disposed at an end of the die pad; and
the second stepped portion is exposed outside a second exterior side surface of the encapsulant.

11. The semiconductor package of claim 10, wherein:
the semiconductor device is electrically coupled to the lead with a conductive clip.

12. The semiconductor package of claim 10, wherein:
the lead has a first width;
the first groove has a second width less than the first width;
the second groove has a third width; and
the third width is less than the second width.

13. The semiconductor package of claim 10, wherein:
the first groove has a first vertical face disposed at a first horizontal length extending inward from the first end;
the second groove has a second vertical face disposed at second horizontal length extending inward from the first end; and
the first horizontal length is greater than the second horizontal length.

14. The semiconductor package of claim 13, wherein the first exterior side surface of the encapsulant does not laterally overlap the first vertical face in a cross-sectional view.

15. The semiconductor package of claim 10, wherein the first end is disposed as part of the die pad.

16. The semiconductor package of claim 10, wherein:
the first groove extends inward from a lower surface of the lead frame; and
the second groove extends further inward from the first groove towards an upper surface of the lead frame.

17. A method of forming an electronic package comprising:
providing a substrate having a first conductive element, wherein:
the first conductive element comprises a first stepped portion disposed at a first end of the first conductive element, the first conductive element having a first width; and
the first stepped portion comprises:
 a first groove extending inward from a lower surface of the first conductive element, the first groove having a second width; and
 a second groove extending further inward from the first groove towards an upper surface of the first conductive element, the second groove having a third width less than the second width;
coupling an electronic component to the first conductive element; and providing an encapsulant encapsulating the electronic component and a portion of the substrate such that the first stepped portion is exposed outside a first exterior side surface of the encapsulant.

18. The method of claim 17, wherein:
providing the substrate comprises providing a lead frame;
providing the substrate further comprises providing a die pad comprising a second stepped portion disposed at a first end of the die pad;
providing the first conductive element comprises providing a lead;
coupling the electronic component comprises electrically connecting the electronic device to the lead using a conductive clip; and
providing the encapsulant comprises providing the encapsulant such that the second stepped portion is exposed outside of a second exterior side surface of the encapsulant.

19. The method of claim 17, wherein:
providing the substrate comprises:
providing the first groove having a first vertical face disposed at a first horizontal length inward from the first end of the first conductive element;
providing the second groove having a second vertical face disposed at second horizontal length inward from the first end of the first conductive element; and
providing the first horizontal length greater than the second horizontal length; and
providing the encapsulant comprises providing the first exterior side surface of the encapsulant such that the first exterior side surface does not laterally overlap the first vertical face in a cross-sectional view.

20. The method of claim 17, wherein:
providing the substrate comprises:
providing the first width greater than the second width.

* * * * *